(12) United States Patent
Zhao et al.

(10) Patent No.: US 12,532,501 B2
(45) Date of Patent: Jan. 20, 2026

(54) STRUCTURE WITH BACK-GATE HAVING OPPOSITELY DOPED SEMICONDUCTOR REGIONS

(71) Applicant: GlobalFoundries U.S. Inc., Malta, NY (US)

(72) Inventors: Zhixing Zhao, Dresden (DE); Tom Herrmann, Dresden (DE); Jegadheesan Venkatesan, Vellore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 533 days.

(21) Appl. No.: 18/056,754

(22) Filed: Nov. 18, 2022

(65) Prior Publication Data
US 2024/0170576 A1    May 23, 2024

(51) Int. Cl.
*H10D 30/63* (2025.01)
*H10D 30/60* (2025.01)
*H10D 86/00* (2025.01)

(52) U.S. Cl.
CPC ......... *H10D 30/637* (2025.01); *H10D 30/611* (2025.01); *H10D 86/201* (2025.01)

(58) Field of Classification Search
CPC ........................................... H10D 62/115–116
See application file for complete search history.

(56) References Cited

U.S. PATENT DOCUMENTS

| 2011/0133822 A1* | 6/2011 | Mazure | H10D 86/201 257/365 |
| 2018/0337596 A1* | 11/2018 | Koe | H02M 3/073 |
| 2019/0035945 A1* | 1/2019 | Li | H10D 62/115 |

OTHER PUBLICATIONS

Othman et al., "Impact of Different Ground Planes of UTBB SOI MOSFETS on Digital and Analog FOM," ARPN Journal of Engineering and Applied Sciences, vol. 11, No. 22, Nov. 2016, pp. 13241-13246.
Rack et al., "A DC-120 GHz SPDT Switch based on 22 nm FD-SOI SLVT NFETs with Substrate Isolation Rings Towards Increased Shunt Impedance," IEEE, 2022, Radio Frequency Integrated Circuits Symposium, pp. 83-86.
Rack et al., "Low-Loss Si-Substrates Enhanced Using Buried PN Junctions for RF Applications," IEEE Electron Device Letters, vol. 40, No. 5, May 2019, pp. 690-693.

* cited by examiner

*Primary Examiner* — Christine S. Kim
*Assistant Examiner* — Cole Leon Lindsey
(74) *Attorney, Agent, or Firm* — Anthony Canale; Hoffman Warnick LLC

(57) ABSTRACT

Embodiments of the disclosure provide a structure with a back-gate having oppositely doped semiconductor regions. The structure may include a transistor over a substrate. The transistor includes a gate structure having a gate length. A back-gate region is within the substrate below the gate structure of the transistor. The back-gate region includes a pair of doped semiconductor regions with a P-N junction therebetween. Each of the pair of semiconductor materials has a length extending substantially in parallel with respect to the gate length.

19 Claims, 7 Drawing Sheets

STRUCTURE WITH BACK-GATE HAVING OPPOSITELY DOPED SEMICONDUCTOR REGIONS

BACKGROUND

1. Technical Field

The present disclosure relates to integrated circuit (IC) technology. Embodiments of the disclosure provide a structure with a back-gate having oppositely doped semiconductor regions.

2. Background Art

Present integrated circuit technology is at atomic level scaling of certain micro-devices such as logic gates, bipolar transistors, field effect transistors (FETs), and capacitors. Circuit chips with millions of such devices are common. In certain technical applications, e.g., radio frequency (RF) devices, conventional transistor structures may experience signal loss due to low resistivity materials within the substrate of the device. These losses may be especially pronounced in devices that feature back-gate biasing of a transistor, i.e., control of a transistor's threshold voltage by electrically biasing semiconductor material(s) located below the transistor gate. At smaller device scale, conventional transistor structures mandate a tradeoff between back-gate controllability and capacitive losses within the substrate material.

SUMMARY

All aspects, examples and features mentioned below can be combined in any technically possible way.

An aspect of the disclosure provides a structure including: a transistor over a substrate, wherein the transistor includes a gate structure having a gate length; and a back-gate region within the substrate below the gate structure of the transistor, the back-gate region including a pair of doped semiconductor regions with a P-N junction therebetween, wherein each of the pair of semiconductor materials has a length extending substantially in parallel with respect to the gate length.

An aspect of the disclosure provides a structure comprising: a back-gate region on a substrate including a plurality of doped semiconductor regions, each of the plurality of doped semiconductor regions having an opposite doping type from an adjacent one of the plurality of doped semiconductor regions; an insulator over the back-gate region; and a transistor on the insulator and including a gate structure over the back-gate region, wherein a length of the gate structure extends substantially in parallel with a length of the back-gate region.

An aspect of the disclosure provides structure including: a back-gate region on a substrate, the back-gate region including: a first doped semiconductor region having a first doping type, and having a length, a second doped semiconductor region having a second doping type and adjacent the first end of the first doped semiconductor region, and a third doped semiconductor region having the second doping type and adjacent the second end of the first doped semiconductor region, an insulator over the back-gate region; and a transistor on the insulator and including a gate structure over the back-gate region, wherein a length of the gate structure extends substantially in parallel with the length of the first doped semiconductor region.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
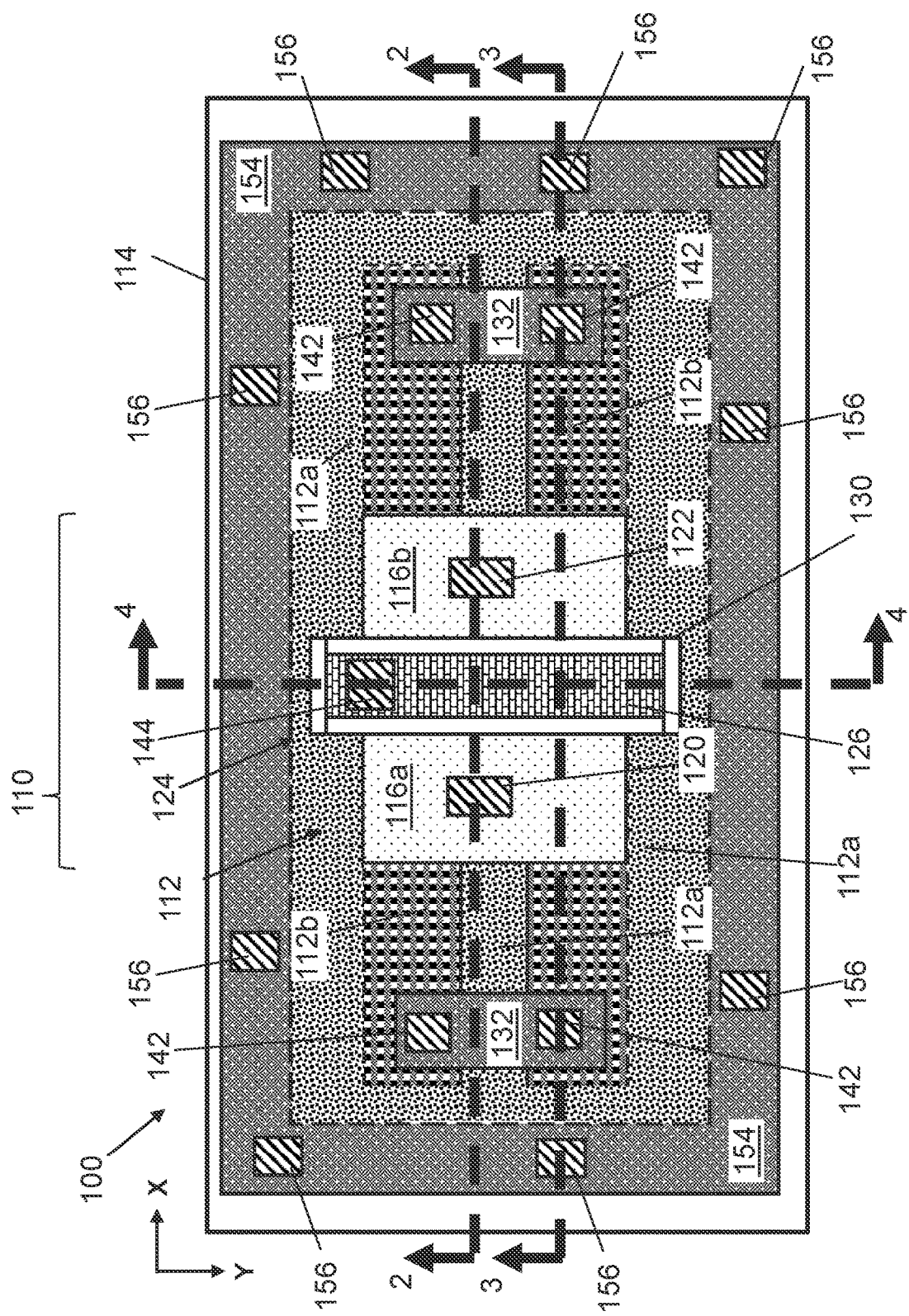
FIG. 1 shows a plan view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure with a back-gate having oppositely doped semiconductor regions. The oppositely doped semiconductor regions within the back-gate may provide technical benefits such as reduced capacitive losses within a device substrate, while retaining the ability to control a transistor's threshold voltage through biasing of the back-gate. The structure may include a transistor over a substrate. The transistor includes a gate structure having a gate length. A back-gate region is within the substrate below the gate structure of the transistor. The back-gate region includes a pair of doped semiconductor regions with a P-N junction therebetween, e.g., arranged in a strip that extends in parallel with the gate structure. Each of the pair of semiconductor materials has a length extending substantially in parallel with respect to the gate length. The number and size of doped semiconductor regions within the back-gate region can vary between embodiments, e.g., there may be two or more oppositely doped semiconductor regions in the back-gate, and each region may be of similar or varying length.

Figure 2:
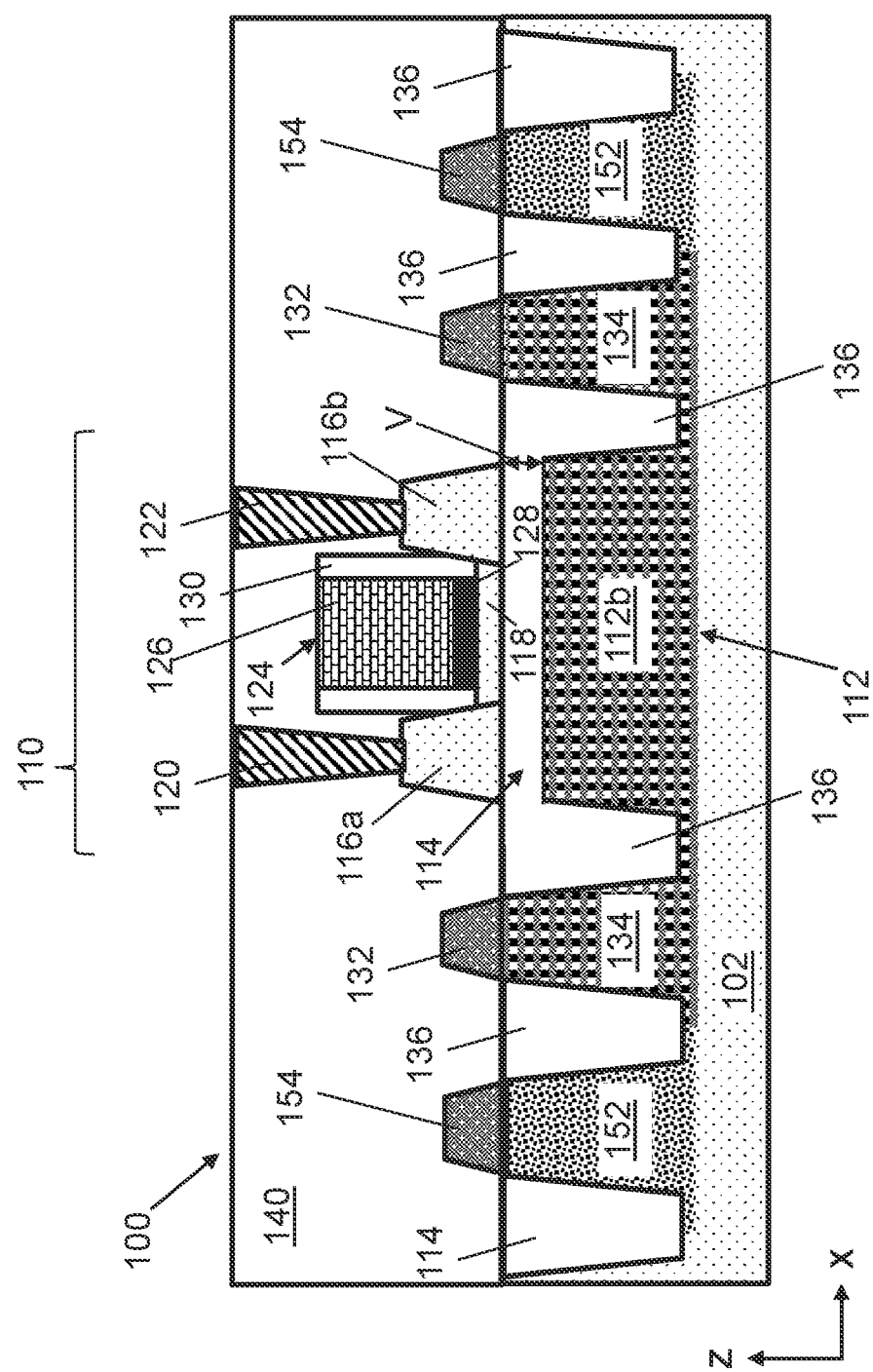
FIG. 2 shows a first cross-sectional view along line 2-2 in FIG. 1 of a structure according to embodiments of the disclosure.
Figure 3:
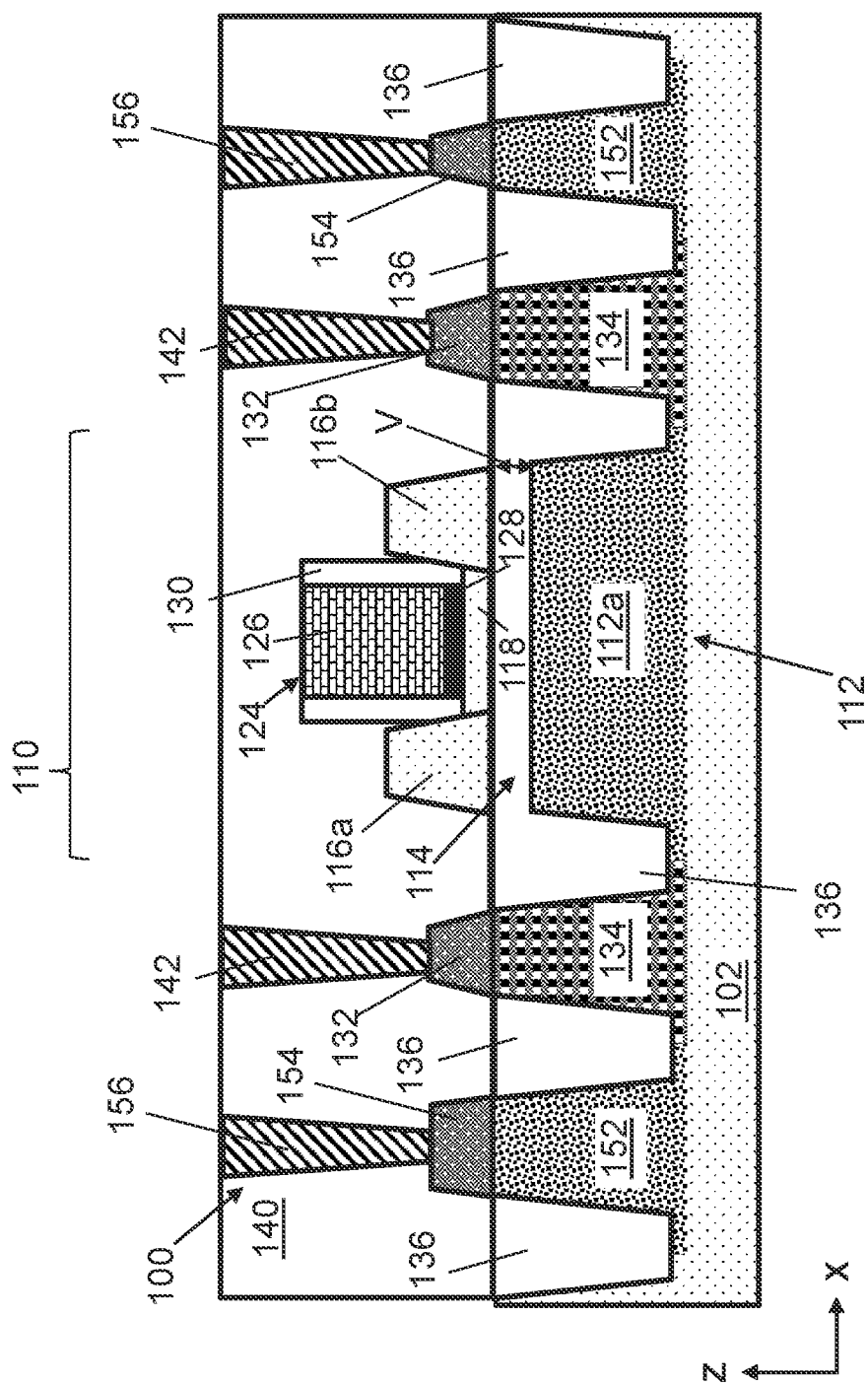
FIG. 3 shows a second cross-sectional view along line 3-3 in FIG. 1 of a structure according to embodiments of the disclosure.

Referring to FIGS. 1-3, FIG. 1 depicts a plan view of a structure 100 according to embodiments of the disclosure whereas FIG. 2 and FIG. 3 depict cross-sectional views of structure 100 along view lines 2-2 and 3-3 of FIG. 1. Structure 100 may be formed on or may include a substrate 102 (FIGS. 2, 3) including, e.g., one or more semiconductor materials. Substrate 102 is omitted from FIG. 1 solely to better illustrate the position of overlying elements, including various electrically active components of structure 100. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained.

Structure 100 may include a transistor 110 over substrate 102. Transistor 110 may be implemented via any currently known or developed type of transistor architecture, e.g., bulk semiconductor field effect transistor, semiconductor on insulator (SOI) fin-type field effect transistor ("FinFET"), nanosheet transistor, and/or any architecture configured for back-gate biasing. Transistor 110 as an example is illustrated in the form of a fully depleted semiconductor on insulator (FDSOI) device.

Transistor 110 and components thereof can be formed over substrate 102. A back-gate region 112, indicated in dashed lines in FIG. 1 to indicate positioning beneath an insulator 114, can have various regions implanted with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation refers to a doping process in which ions are accelerated toward a solid surface to penetrate the solid up to a predetermined range based on the energy of the implanted ions. However, back-gate region 112 may be doped by any currently known or later developed doping technique.

Back-gate region 112 can include the same material composition as the remainder of substrate 102 but can additionally include dopant materials therein. Insulator 114, also known in the art as a "buried oxide" or "BOX" layer, can separate back-gate region 112 of substrate 102 from source/drain regions 116a, 116b and a channel region 118 of transistor 110. Insulator 114 may be composed of one or more oxide compounds, and/or any other currently known or later-developed electrically insulative substances. In embodiments where transistor 110 includes an FDSOI structure, it is distinguishable from other types of transistors by featuring an adjustable electric potential within back-gate region 112, e.g., by a vertical thickness of insulator 114 between transistor 110 and back-gate region 112 being at most approximately twenty nanometers (nm).

Source/drain regions 116a, 116b and channel region 118 may electrically couple a source contact 120 of transistor 110 to a drain contact 122 of transistor 110 when transistor 110 is in an ON state. A gate structure 124 can be positioned over channel region 118, such that a voltage applied to a gate conductor 126 of gate structure 124 controls the electrical conductivity between source and drain contacts 120, 122 through source/drain regions 116a, 116b and channel region 118. Gate conductor 126 may include, e.g., polycrystalline silicon, one or more electrically conductive metals, and/or other gate formation material(s) therein in addition to a gate dielectric material 128 (indicated with black shading between bottom of gate conductor 126 and channel region 118) for separating the conductive metal(s) of gate structure 124 from at least channel region 118. Gate structure 124 further may include one or more spacers 130 along its perimeter. Spacer(s) 130 may be formed of dielectric materials (e.g., one or more insulative substances suitable for use as or within insulator 114, and/or any other currently known or later developed insulative materials) to prevent electrical shorting between gate conductor 126 and other electrically active materials of the device.

Back-gate region 112 can be electrically coupled to a back-gate node 132 through back-gate terminals 134 on substrate 102 to further influence the characteristics of transistor 110, e.g., the conductivity between source and drain contacts 120, 122 through source/drain regions 116a, 116b and channel region 118. Applying an electrical potential to back-gate terminals 134 at back-gate node 132 can induce an electric charge within back-gate region 112, thereby creating a difference in electrical potential between back-gate region 112 and source/drain regions 116a, 116b, channel region 118, across insulator 114. Among other effects, this difference in electrical potential between back-gate region 112 and source/drain regions 116a, 116b, channel region 118 and substrate 102 can affect the threshold voltage of transistor 110, i.e., the minimum voltage for inducing electrical conductivity across source/drain and channel regions 116a, 116b, 118 between source and drain contacts 120, 122, as discussed herein.

Structure 100 and/or insulator 114 may include a group of trench isolation (TI) regions 136 to electrically separate the various regions of transistor 110 from parts of other transistors. TI regions 136 may be composed of any insulating material such as silicon oxide, e.g., $SiO_2$. Other materials appropriate for the composition of TI regions 136 may include, for example, borophosphosilicate glass (BPSG), spin-on glass and/or spin-on polymers, other insulators having an effective dielectric constant of less than approximately 3.9, and/or other currently known or later-developed materials having similar properties.

Applying a back-gate biasing voltage to back-gate terminals 134 can shift (i.e., raise or lower) the threshold voltage of transistor 110. Among other benefits, reducing the threshold voltage of transistor 110 can increase overdrive voltage (i.e., the difference between gate-source voltage and threshold voltage), particularly in power amplification settings. In an FDSOI device, reducing the threshold voltage may allow for easier operation within the FDSOI device's smaller dimensionality and surface area. thereby reducing source drain resistance and increasing drain current. In an FDSOI architecture, biasing of back-gate region 112, can allow transistor 110 to be less wide relative to conventional applications and transistor structures, e.g., saving silicon area. In an example embodiment, a width of source/drain and channel regions 116a, 116b, 118 (i.e., dimension along the X axis in FIGS. 2, 3) can be between approximately 300 nanometers (nm) and approximately 31,000 nm. A length of source/drain and channel regions 116a, 116b, 118 (i.e., left to right within the plane of the page) between source and drain contacts 120, 122 can be, e.g., approximately twenty nanometers (nm). FDSOI technology transistors, e.g., transistor 110, offer a stronger ability to apply a voltage bias to back-gate region 112 to manipulate the threshold voltage V t (i.e., minimum voltage for channel formation) of transistor 110. As described herein, back-gate region 112 can allow a user to manipulate the threshold voltage of gate structure 124 to control the channel formation within channel region 118.

Figure 4:
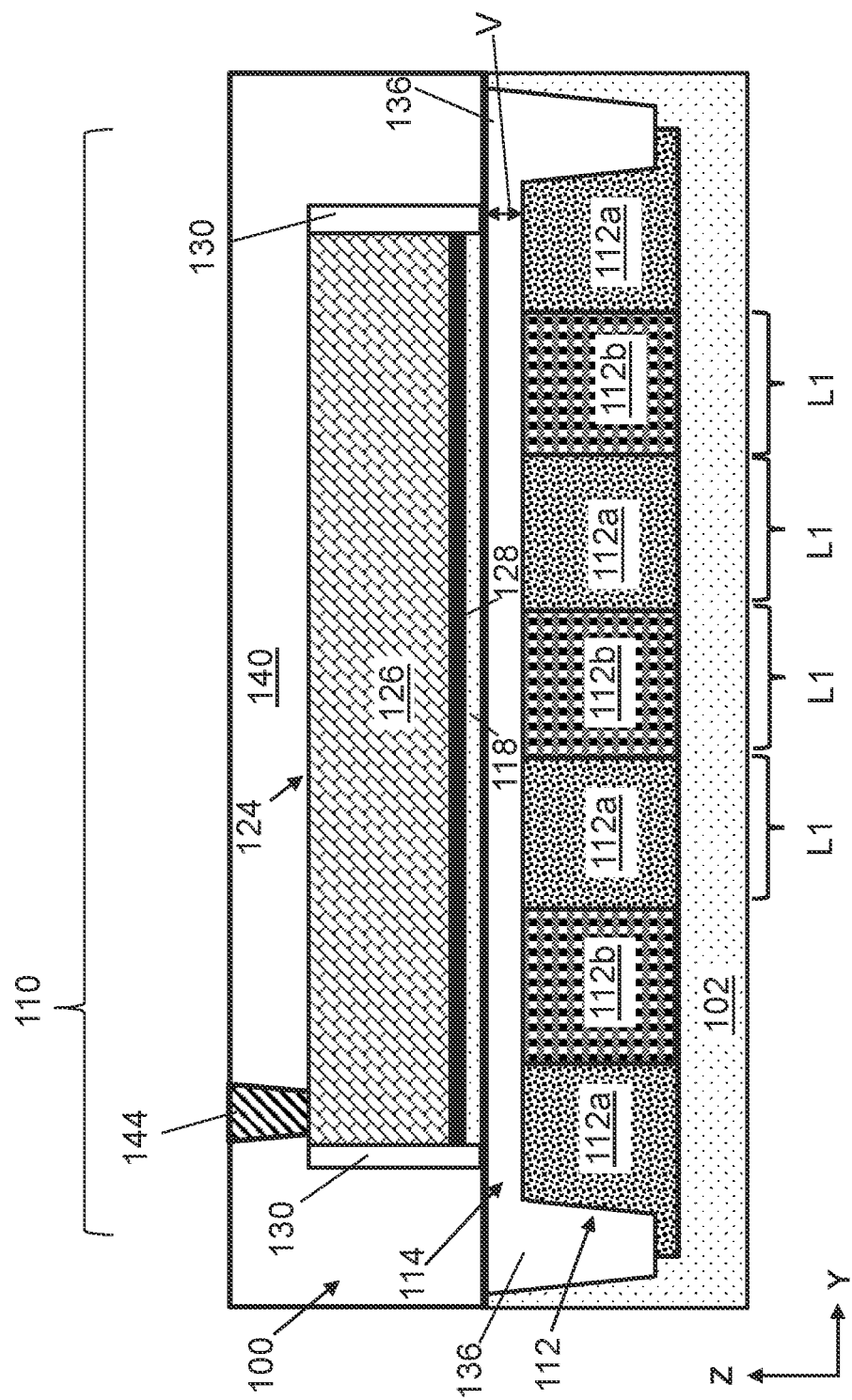
FIG. 4 shows a third cross-sectional view along line 4-4 in FIG. 1 of a structure according to embodiments of the disclosure.

Referring to FIGS. 1 and 4 together, embodiments of structure 100 may further increase the ability to bias transistor 110, regardless of whether an FDSOI architecture is used, by including a set of oppositely doped semiconductor materials within back-gate region 112 to form multiple P-N junctions. The term "P-N" refers to two adjacent materials having different types of conductivity (i.e., P-type and N-type), which may be induced through dopants within the adjacent material(s). A P-N junction, when formed in a device may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

As shown in FIGS. 1-4, back-gate region 112 may include several doped semiconductor regions 112a (FIGS. 1, 3, 4), 112b (FIGS. 1, 2, 4). Doped semiconductor regions 112a may have a first doping type (e.g., P-type doping) whereas doped semiconductor regions 112b may have a second, opposite doping type (e.g., N-type doping) such that adjacent pairs of semiconductor regions 112a, 112b define a P-N junction therebetween. Back-gate region 112 may include two or more pairs of doped semiconductor regions 112a, 112b (e.g., three pairs shown in FIG. 3), although this is not necessarily required in all implementations. The pairs of alternating doped semiconductor regions 112a, 112b may extend substantially in parallel with the length of gate conductor 126 (e.g., the Y-axis in FIGS. 1, 4). The total number of doped semiconductor regions 112a, 112b may depend on the length of gate structure 124 and/or the techniques used to form doped semiconductor regions 112a, 112b. In some cases, multiple doped semiconductor regions 112a, 112b may have a same or substantially identical length L1 (FIG. 4), e.g., one-hundred nm in the direction of the Y-axis. Each doped semiconductor region 112a, 112b may be adjacent a portion of one back-gate terminal 134, or as shown specifically in FIGS. 2 and 3, may be horizontally between two back-gate terminals 134 at opposite horizontal ends of transistor 110.

Doped semiconductor regions 112a may have the same doping type as substrate 102, and the voltage of doped semiconductor region(s) 112a may be set to a supply voltage ($V_{ss}$) or ground (GND). Doped semiconductor regions 112b has the opposite doping type from doped semiconductor region(s) 112a and substrate 102 and can be set to a back-gate biasing voltage via back-gate terminal(s) 134 discussed herein. Embodiments of the disclosure, including a horizontally oriented PN junction below transistor 110, include alternating segments capable of being set to a back-gate biasing voltage alternating with other segments that are not set to the back-gate biasing voltage. Doped semiconductor regions 112a can exhibit higher resistivity than doped semiconductor regions 112b, due to the difference in voltage(s) applied thereto. Thus, embodiments of structure 100 combine both a high substrate resistivity region (e.g., in region 112a) and a region with back-gate biasing (e.g., region 112b). Thus, the back-gate material(s) of structure 100 is adjustable but less sensitive than a device with only one back-gate material below a transistor.

Structure 100 may include an inter-level dielectric (ILD) layer 140 above substrate 102, back-gate region 112, and transistor 110. ILD layer 140 may be formed by any appropriate deposition or other techniques of forming an insulative material on a structure. ILD layer 140, in this position also may surround the outer periphery of each element formed on or over insulator 114 and TI regions 136. ILD layer 140 may include the same insulating material as insulator 114 or may include a different electrically insulative material for vertically separating structure 100 from overlying materials, e.g., various horizontally extending wires or vias. ILD layer 140 and insulator 114 nonetheless constitute different components, e.g., due to some portions of insulator 114 being below transistor 110 as discussed herein. When ILD layer 140 is formed, it can be planarized (e.g., using chemical mechanical polishing (CMP)), but its upper surface may remain above transistor 110. ILD layer 140 may entirely cover transistor 110 except in locations where conductive contacts are formed.

Structure 100 may include a set of back-gate contacts 142 on back-gate node 132. A gate contact 144 to gate structure 124 also may be within ILD layer 140. One or more of contacts 142, 144, as well as S/D contacts 120, 122, to overlying circuit elements may be formed within predetermined portions of ILD layer 140 by a controlled amount of vertical etching to form openings to one or more contact sites, and then filling the openings with a conductor. Each contact 120, 122, 142, 144 may include any currently known or later developed conductive material configured for use in an electrical contact, e.g., tungsten (W), copper (Cu), aluminum (Al), etc. Contacts 120, 122, 142, 144 may additionally include refractory metal liners (not shown) positioned alongside ILD layer 140 to prevent electromigration degradation, shorting to other components, etc. Additionally, silicide material(s) (not shown) may be formed on portions of emitter S/D regions 116a, 116b, back-gate node 132, and/or other semiconductor materials by depositing a metal on semiconductor material thereof, annealing the metal to form silicide material(s), and removing any non-annealed metal.

Structure 100 additionally may include an adjacent semiconductor material 152 (FIGS. 2, 3) on substrate 102 and adjacent back-gate terminal 134. Adjacent semiconductor material 152 may include a region of doped semiconductor material separated from back-gate terminal 134 by TI region(s) 136. Adjacent semiconductor material 152, moreover, may have an opposite doping type relative to back-gate terminal 134 such that a P-N junction is present between back-gate terminal 134 and adjacent semiconductor material 152. An overlying node 154 may be on biasing semiconductor material 152 and may be coupled to ground or a supply voltage as discussed herein. Thus, overlying node 154 may not allow direct electrical biasing of back-gate region 112.

Figure 5:
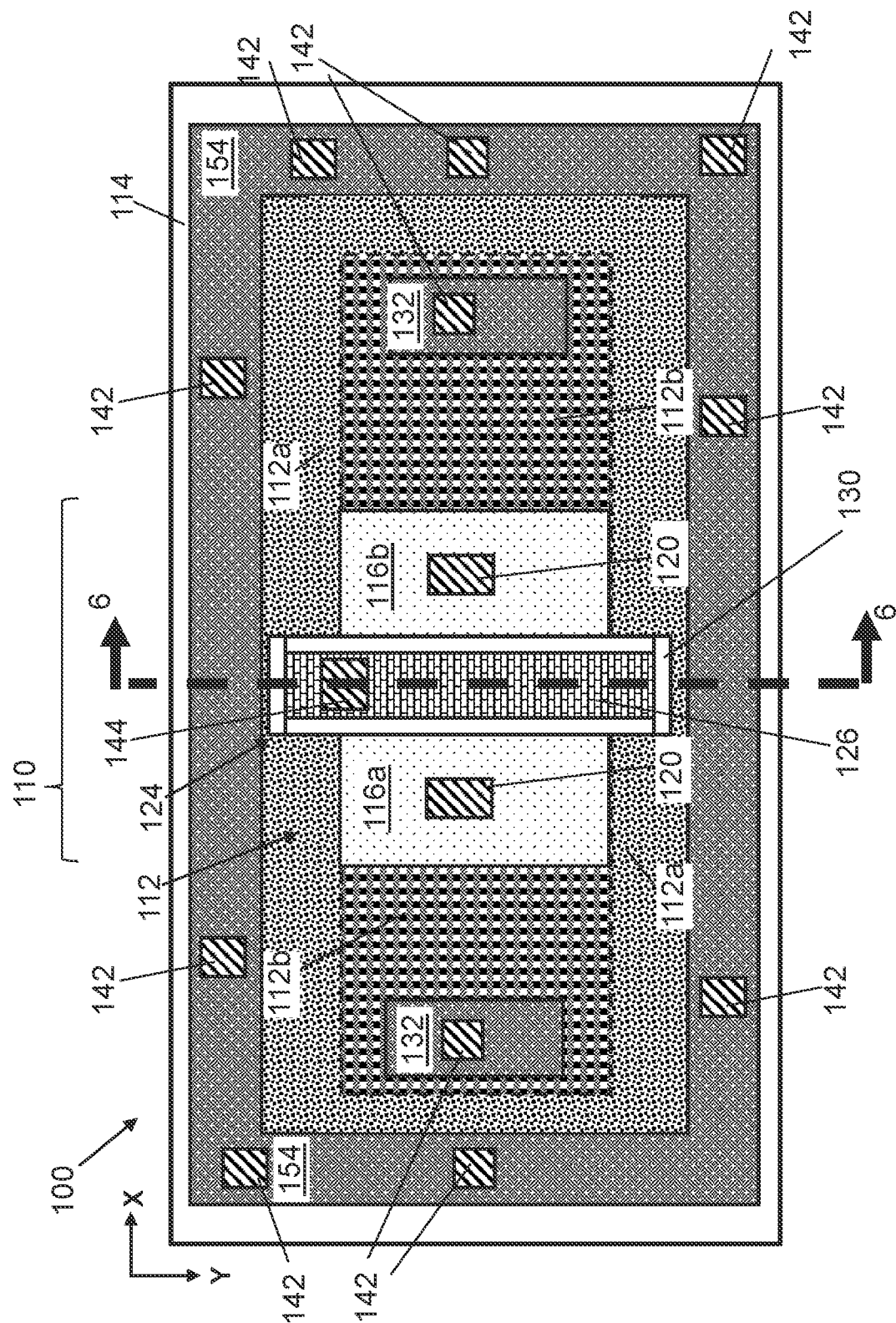
FIG. 5 shows a plan view of a structure according to further embodiments of the disclosure.
Figure 6:
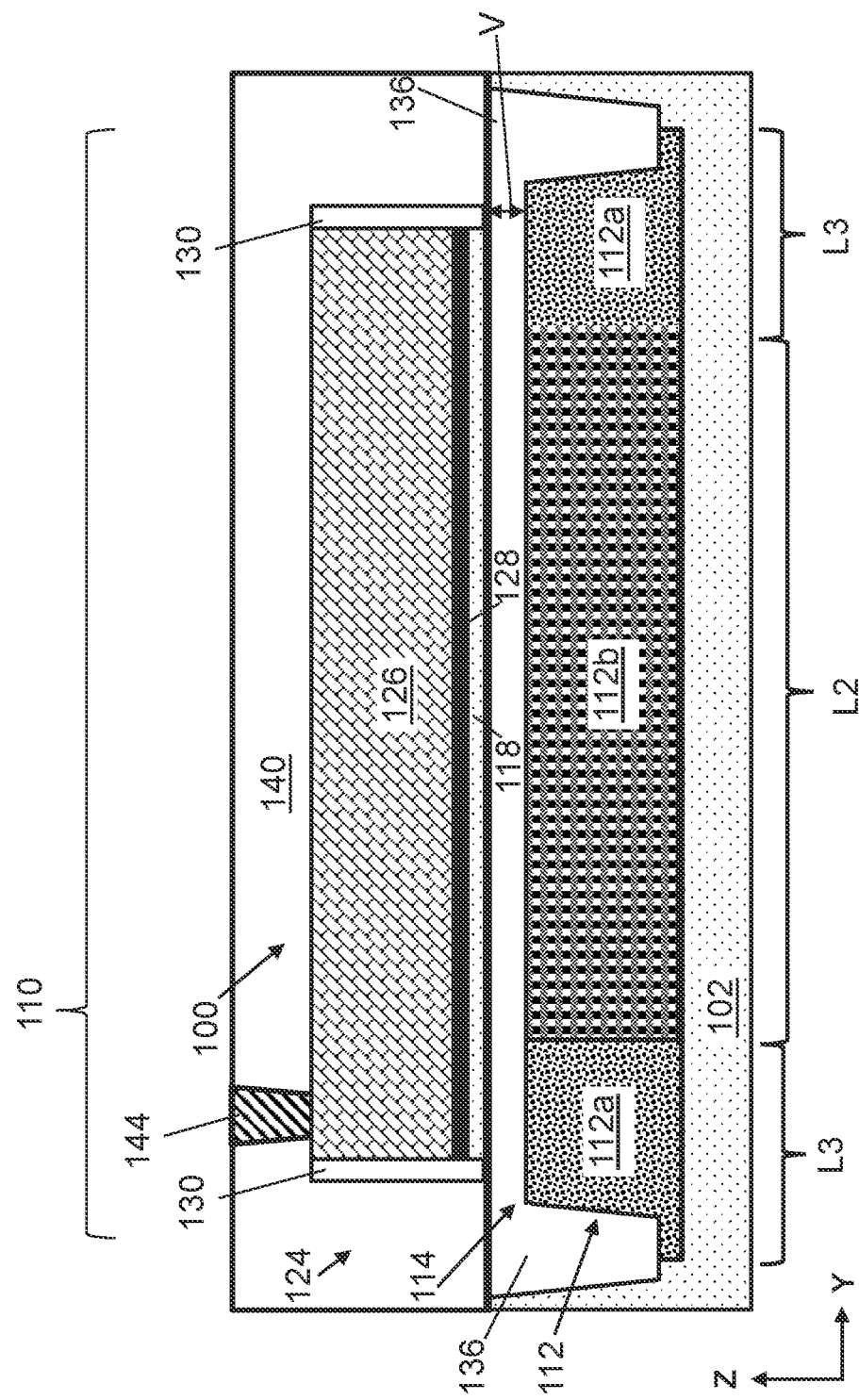
FIG. 6 shows a cross-sectional view along line 6-6 in FIG. 5 of a structure according to further embodiments of the disclosure.

FIGS. 5 and 6 depict structure 100 according to further implementations, e.g., where doped semiconductor regions 112a, 112b of back-gate region 112 are not uniform in size and/or number. For example, back-gate region 112 of structure 100 may include two doped semiconductor regions 112a below opposite lengthwise ends of gate structure 124. In addition, another doped semiconductor region 112b of opposite doping type from doped semiconductor regions 112a may be horizontally between doped semiconductor regions 112a. Doped semiconductor region 112b may have a length L2 that is larger than lengths L3 of doped semiconductor regions 112a, thus defining two P-N junctions below gate structure 124. Length L2 may be significantly larger than lengths L3, e.g., it may extend below a majority of the length of gate structure 124. Thus, length L2 of doped semiconductor region 112b may be several times larger (e.g., three, four, or five times) larger than doped semiconductor region 112a. In all other respects, however, structure 100, transistor 110, and/or back-gate region 112 may be similar or identical to other implementations of structure 100.

Embodiments of the disclosure provide various technical and commercial advantages, examples of which are discussed herein. Among other benefits, structure 100 reduces capacitive losses through substrate 102 by using P-N junctions between doped semiconductor regions 112a, 112b to prevent capacitive junctions from forming with active material(s) near or adjacent structure 100. These characteristics may be particularly beneficial in power amplification and/or switching applications where multiple transistors 110 may be used to transmit particularly large amounts of voltage and/or current therethrough. It has been determined that forming multiple alternately doped semiconductor regions 112a, 112b within back-gate region 112 achieves an approximately fifty percent reduction in back-gate to gate capacitance, and a corresponding reduction in voltage across these two terminals, as compared to transistor structures where the back-gate region only has a single doping type. In addition, structure of back-gate region 112 remains operable for biasing to allow the threshold voltage of transistor 110 to be controlled, e.g., where transistor 110 includes an FDSOI architecture. These and other advantages may arise, e.g., from the P-N junction between a pair of doped semiconductor regions 112a, 112b being directly below gate structure 124, and oriented substantially in parallel with the length of gate structure 124, rather than being horizontally distal to gate structure 124. Similarly, these and other technical benefits are increased by including biasing node 154 at a position horizontally distal to transistor 110 and back-gate region 112 to lessen the direct effects of further biasing on back-gate region 112.

Figure 7:
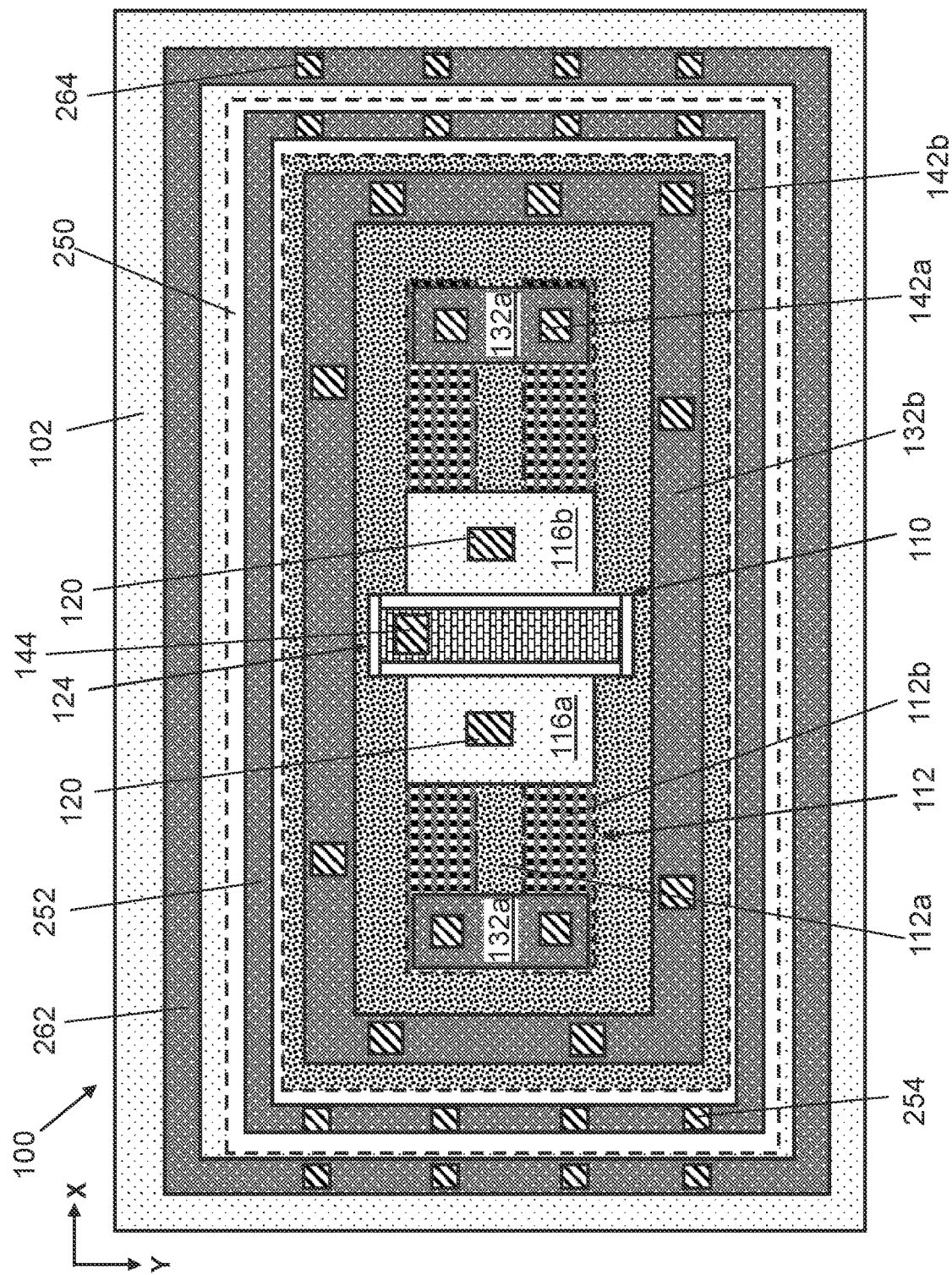
FIG. 7 shows a plan view of a structure according to further embodiments of the disclosure.

FIG. 7 depicts a further implementation of structure 100 in which doped semiconductor regions 112a, 112b may be set to distinct voltages, e.g., such that the back gate of transistor 110 may be biased using either or both doped semiconductor regions 112a, 112b. Doped semiconductor region(s) 112b and couplings thereto may be structured and/or operationally identical to other implementations of structure 100 discussed herein. Structure 100 may include a first set of back-gate nodes 132a and back-gate contacts 142a for coupling to and biasing of doped semiconductor regions 112a. Structure 100 additionally may include a second (e.g., ring-shaped) back-gate node 132b and back-gate contacts 142b for coupling to and biasing of the oppositely doped semiconductor regions 112b. To accommodate this configuration, structure 100 may include a doped well region 250 surrounding and/or horizontally adjacent second back-gate node 132, in which a well node 252 and well contacts 254 may couple doped well region 250 to ground or a supply voltage source. Doped well region 250 may have a same doping polarity as semiconductor regions 112b, e.g., to provide alternating polarity semiconductor materials and P-N junctions in a configuration similar to other implementations. Substrate 102 may be adjacent to and/or may surround doped well region 250. Substrate 102 also may include a substrate node 262 and substrate contacts 264, e.g., to provide electrical coupling to substrate 102 where desired.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
    a back-gate region on a substrate, the back-gate region including:
        a first doped semiconductor region having a first doping type, and having a length,
        a second doped semiconductor region having the first doping type and spaced from the first doped semiconductor region, and
        a third doped semiconductor region, having a second doping type different than the first doping type, horizontally surrounding and separating, the second doped semiconductor region and the first doped semiconductor region;
    an insulator over the back-gate region; and
    a transistor on the insulator and including a gate structure over the back-gate region, wherein a length of the gate structure extends substantially in parallel with a length of the back-gate region.

2. The structure of claim 1, further comprising a back-gate terminal adjacent one of the first doped semiconductor region and the second doped semiconductor region.

3. The structure of claim 2, further comprising a back-gate contact on the back-gate terminal, wherein a trench isolation horizontally separates a portion of the back-gate terminal from the back-gate region and the transistor.

4. The structure of claim 2, further comprising a biasing semiconductor material adjacent the back-gate terminal, wherein the biasing semiconductor material has an opposite doping type from the back-gate terminal.

5. The structure of claim 1, wherein a vertical thickness of the insulator between the back-gate region and the transistor is approximately twenty nanometers (nm).

6. The structure of claim 1, wherein a length of the third doped semiconductor region is larger than the length of the first doped semiconductor region and a length of the second semiconductor region.

7. The structure of claim 1, wherein the first doped semiconductor region and the second doped semiconductor region have a same length.

8. The structure of claim 1, further comprising a source/drain (S/D) material on the insulator and adjacent the gate structure, wherein the S/D material is coupled to a fully depleted semiconductor on insulator (FDSOI) channel region of the transistor.

9. A structure comprising:
    a back-gate region on a substrate, the back-gate region including:
        a first doped semiconductor region having a first doping type, and having a length,
        a second doped semiconductor region having a second doping type different than the first doping type and adjacent the first end of the first doped semiconductor region, and
        a third doped semiconductor region having the second doping type and adjacent the second end of the first doped semiconductor region,
    an insulator over the back-gate region; and
    a transistor on the insulator and including a gate structure immediately over the back-gate region, wherein a length of the gate structure extends substantially in parallel with the length of the first doped semiconductor region.

10. The structure of claim 9, wherein the length of the first doped semiconductor region is larger than a length of the second doped semiconductor region and a length of the third semiconductor region.

11. The structure of claim 9, further comprising a back-gate terminal adjacent one of the second doped semiconductor region and the third doped semiconductor region.

12. The structure of claim 11, further comprising a back-gate contact on the back-gate terminal, wherein a trench isolation horizontally separates a portion of the back-gate terminal from the back-gate region and the transistor.

13. The structure of claim 11, further comprising a biasing semiconductor material adjacent the back-gate terminal, wherein the biasing semiconductor material has an opposite doping type from the back-gate terminal.

14. The structure of claim 9, further comprising a source/drain (S/D) material on the insulator and adjacent the gate structure, wherein the S/D material is coupled to a fully depleted semiconductor on insulator (FDSOI) channel region of the transistor.

15. The structure of claim 9, wherein a vertical thickness of the insulator between the back-gate region and the transistor is approximately twenty nanometers (nm).

16. A structure comprising:
    a back-gate region on a substrate, the back-gate region including:

a first doped semiconductor region having a first doping type, and having a length, a second doped semiconductor region having the first doping type and spaced from the first doped semiconductor region, and a third doped semiconductor region, having a second doping type different than the first doping type, horizontally surrounding and separating, the second doped semiconductor region and the first doped semiconductor region;

an insulator over the back-gate region; and a transistor on the insulator and including a gate structure immediately over the back-gate region, wherein a length of the gate structure extends substantially in parallel with a length of the back-gate region.

17. The structure of claim 16, further comprising a back-gate terminal adjacent one of the first doped semiconductor region and the second doped semiconductor region.

18. The structure of claim 17, further comprising a back-gate contact on the back-gate terminal, wherein a trench isolation horizontally separates a portion of the back-gate terminal from the back-gate region and the transistor.

19. The structure of claim 17, further comprising a biasing semiconductor material adjacent the back-gate terminal, wherein the biasing semiconductor material has an opposite doping type from the back-gate terminal.

* * * * *